(12) United States Patent
Zanon et al.

(10) Patent No.: US 10,371,357 B2
(45) Date of Patent: Aug. 6, 2019

(54) ELECTRONIC COMPONENT AND CORRESPONDING MOUNTING METHOD

(71) Applicant: OSRAM GmbH, Munich (DE)

(72) Inventors: Franco Zanon, Cassola (IT); Alessio Griffoni, Fosso (IT)

(73) Assignee: OSRAM GmbH, Munich (DE)

( * ) Notice: Subject to any disclaimer, the term of this patent is extended or adjusted under 35 U.S.C. 154(b) by 602 days.

(21) Appl. No.: 14/937,981

(22) Filed: Nov. 11, 2015

(65) Prior Publication Data
US 2016/0131340 A1 May 12, 2016

(30) Foreign Application Priority Data
Nov. 12, 2014 (IT) .............................. TO2014A0942

(51) Int. Cl.
H01L 27/15 (2006.01)
F21V 19/00 (2006.01)
H01L 33/64 (2010.01)
H05K 1/11 (2006.01)
H01L 33/62 (2010.01)
H05K 3/34 (2006.01)

(52) U.S. Cl.
CPC ........ F21V 19/0025 (2013.01); H01L 33/647 (2013.01); H01L 33/62 (2013.01); H05K 1/111 (2013.01); H05K 3/3431 (2013.01); H05K 3/3436 (2013.01); H05K 2201/10106 (2013.01)

(58) Field of Classification Search
None
See application file for complete search history.

(56) References Cited

U.S. PATENT DOCUMENTS

2007/0235748 A1* 10/2007 Tamura ................... H01L 33/20
257/99
2014/0146505 A1 5/2014 Su et al.
2014/0217456 A1 8/2014 Ahn et al.

OTHER PUBLICATIONS

Italian Search Report based on application No. TO2014A000942 (2 pages) dated Jul. 17, 2015.

* cited by examiner

Primary Examiner — Jack S Chen
(74) Attorney, Agent, or Firm — Vierling Jentschura & Partner MBB

(57) ABSTRACT

An electronic component may include e.g. a solid-state light radiation source, preferably a LED light radiation source, is provided with electrical contact pads for soldering onto a mounting board. The electrical contact pads are arranged over a soldering area having a central portion and a peripheral portion surrounding said central portion.
The electrical contact pads include at least one first electrical contact pad arranged at central portion of the soldering area, and at least one second electrical contact pad arranged at peripheral portion of the soldering area.

8 Claims, 4 Drawing Sheets

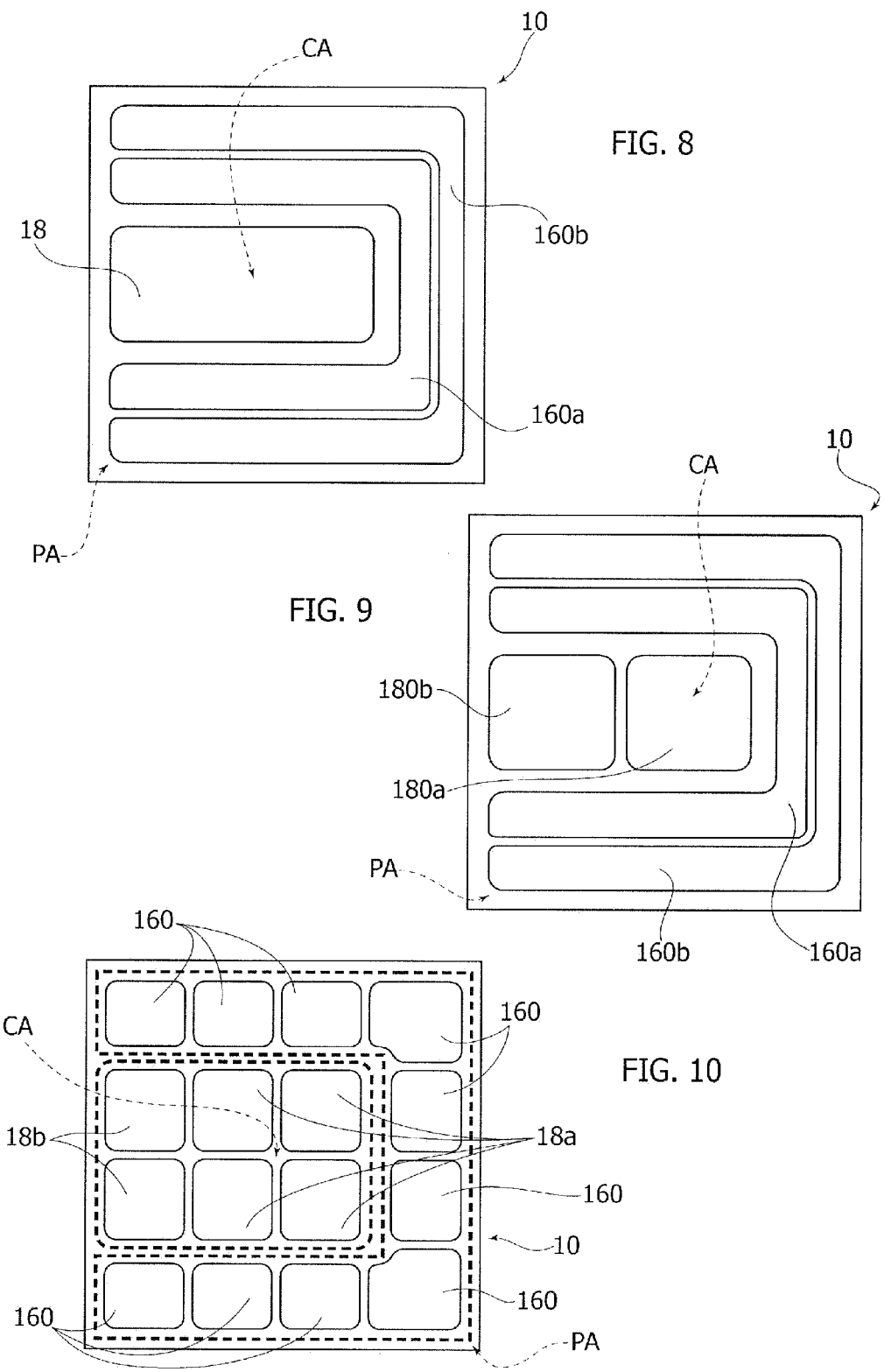

ELECTRONIC COMPONENT AND CORRESPONDING MOUNTING METHOD

CROSS-REFERENCE TO RELATED APPLICATION

This application claims priority to Italian Patent Application Serial No. TO2014A000942, which was filed Nov. 12, 2014, and is incorporated herein by reference in its entirety.

TECHNICAL FIELD

Various embodiments may generally relate to electronic components.

Various embodiments may refer to electronic components such as solid-state light radiation sources, e.g. LED sources, adapted to be mounted onto boards.

BACKGROUND

Solid-state lighting modules, such as LED lighting modules, may have strict specifications as regards e.g. high light flux (e.g. >10,000 lm), high power efficiency (e.g. >120 lm/W), low cost, high electrical insulation (e.g. >2 kV AC) and high reliability (e.g. only 5% of LED modules may experience a failure after 100,000 working hours).

It has been ascertained that an important factor in causing failures consists of failures in solder joints, e.g. when high-power LEDs with ceramic package are soldered onto Insulated Metal Substrate (IMS) boards, especially when the base metal is aluminium.

One of the factors which may play a role in causing failures consists of thermo-mechanical stresses, such as the strain induced during thermal cycles by a mismatch in the CTEs (Coefficient of Thermal Expansion) of the component (e.g. the LED), the solder joints and the mounting board, e.g. the Printed Circuit Board (PCB).

It has been observed that a way to improve the reliability of solder joints, e.g. for LED components, may involve the use of IMS boards with a base metal such as copper, having a low CTE, and/or the use of dielectric materials with a low Young's modulus. These solutions, however, may involve various drawbacks regarding cost increase, galvanic corrosion and reduced reliability of the electrical insulation.

It has moreover been observed that it is possible to employ, instead of IMS boards, FR4 or ceramic boards. The former solution involves a lower thermal dissipation than IMS boards. The second solution has rather high costs and exhibits a large sensitivity to vibrations.

Still another solution may be the use of components (e.g. LEDs) with a plastic package. This however leads to a strong reduction in the performances (specifically in output light flux and efficiency) due to the higher thermal resistance of plastic packages in comparison with ceramic packages.

SUMMARY

According to various embodiments, an electronic component is provided.

Various embodiments may concern a corresponding method.

Various embodiments may lead to an improvement of reliability of solder joints without affecting the performances of the component (e.g., of the LED) and/or of the board or of the solder paste.

Various embodiments may be based on the implementation, if necessary in combination, of one or more of the following features:

limitation of the areas wherein a crack may propagate, so that the other areas not subjected to cracking may exhibit a substantially unchanged performance, increasing the areas of the most sensitive solder joints, in order to increase the number of cycles needed to bring about a possible crack of the solder joint, and/or resorting to a redundancy of the component pads, especially as regards the pads which are most heavily subjected to creep strain, in order to reduce the failure rate due to cracks.

Various embodiments enable to improve the solder-joint reliability in PBAs without affecting the performances of the component (e.g. LED) or requiring modifications in the board or in the solder paste.

Various embodiments may be used with packages of various kinds (therefore, not only with ceramic packages) and with solder pastes which are deposited in different ways.

Various embodiments allow moreover to determine the arrangement of the electrical pads according to the application needs, e.g. according to the package size.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 6 to 10 show various possible implementation solutions for electrical contact pads for a component according to FIG. 2.

DETAILED DESCRIPTION

In the following description, numerous specific details are given to provide a thorough understanding of one or more exemplary embodiments. The embodiments may be practiced without one or several specific details, or with other methods, components, materials, etc. In other instances, well-known structures, materials, or operations are not shown or described in detail to avoid obscuring various aspects of the embodiments. Reference throughout this specification to "one embodiment" or "an embodiment" means that a particular feature, structure, or characteristic described in connection with the embodiment is included in at least one embodiment. Thus, the possible appearances of the phrases "in one embodiment" or "in an embodiment" in various places throughout this specification are not necessarily all referring to the same embodiment. Furthermore, particular features, structures, or characteristics may be combined in any suitable manner in one or more embodiments, and/or may be associated to the embodiments in a different way from what is shown herein, so that e.g. a feature herein exemplified in connection to a Figure may be applied to one or more embodiments exemplified in a different Figure.

Specifically, a given feature exemplified herein with reference to an embodiment shown in one of the annexed Figures may be applied to an embodiment shown in any other Figure.

The headings provided herein are for convenience only, and therefore do not interpret the extent of protection or meaning of the embodiments.

Figure 1:
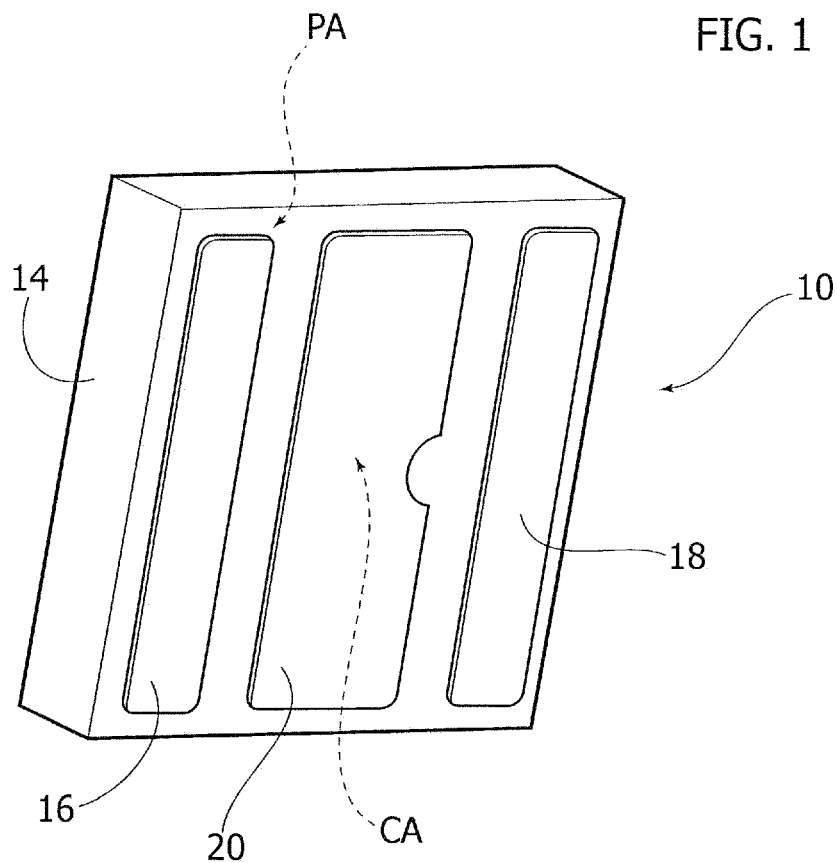
FIG. 1 is a view of an electronic component, e.g. a LED, with conventional contact pads.

FIG. 1 shows an electronic component 10 adapted to be mounted onto a mounting board 12 (see for example FIGS. 4 and 5) for example a PCB (Printed Circuit Board).

Electronic component 10 may be for example a solid-state light radiation source, e.g. a LED light radiation source, such as a power LED.

Such an electronic component may include a so-called package 14, e.g. a ceramic package, which is provided on the underside with pads enabling the mounting of component 10 onto a board 12, e.g. an IMS (Insulated Metal Substrate) board, by ensuring the electrical contact thereof with supply circuits (which are not visible in the Figures).

According to a conventional solution, shown in FIG. 1, component 10 (specifically the back side thereof, which will face mounting board 12) may include:

two electrical contact pads (in the following we will use this term, which is widely used in the related technology), of an electrically conductive material, e.g. a metal, which are respectively an anode 16 and a cathode 18, and a pad 20 of a thermally conductive material, having a heat dissipation function.

Such a component 10 may be mounted onto a board 12 (e.g. a PCB of the IMS type) by resorting to a layout of mounting contacts formed via known techniques onto the surface of board 12, including e.g. a material such as copper, so as to be both electrically and thermally conductive. These contacts define land areas which are adapted to cooperate with pads 16, 18 and 20 provided on electronic component 10.

To this end, in order to perform the mounting (with an electrical and heat dissipating mechanical connection), solder pastes may be used which are adapted to be interposed between each pad and a corresponding land area.

As schematically shown by a dotted line in FIG. 1, anode and cathode electrical contact pads 16 and 18, as well as thermal contact pads 20, may be seen as being distributed over the whole back surface of component 10 (the face which will be mounted onto board 12). Such a soldering area includes a central portion CA surrounded by a peripheral or outer portion PA.

In the conventional solution as shown in FIG. 1:

thermal contact pad 20 extends over both central portion CA and peripheral portion PA, and anode 16 and cathode 18 contact pads extend over peripheral portion PA only, along the sides of the package (which may have a square or rectangular shape) practically over the whole length of the respective side.

It has been ascertained that the creep strain caused by thermal cycles onto the solder joints of the pads grows as the distance from central portion CA increases, and reaches the highest level at the package corners, i.e. at the ends of anode pad 16 and cathode pad 18. These areas are most subject to crack initiation, which may propagate towards the more central areas, which in themselves are less sensitive to cracks.

Various embodiments as exemplified in FIG. 2 and in the following figures aim at overcoming such a drawback.

Figure 2:
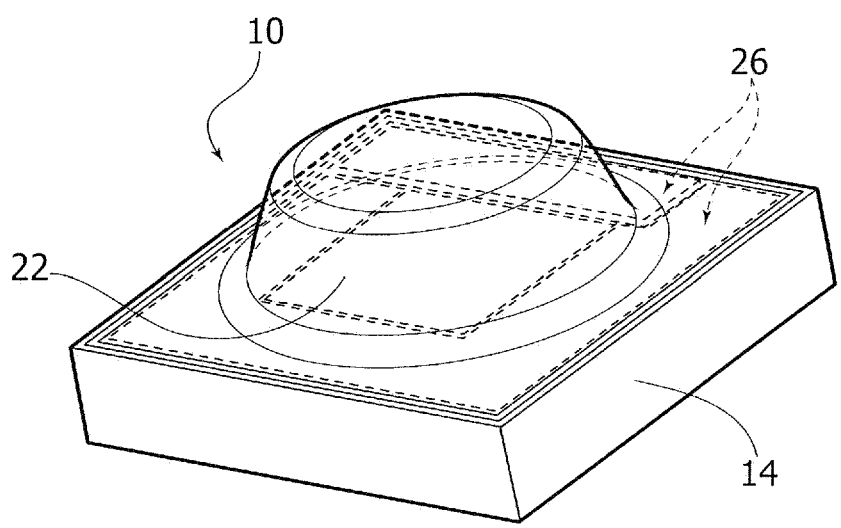
FIG. 2 is a view of a LED electronic component according to various embodiments, in a perspective view from the front.

Various embodiments may be applied to an electronic component 10 as exemplified in FIG. 2, i.e. for example to a solid-state lighting source wherein, mounted in a package 14, e.g. a ceramic package, there is provided a LED radiation source 22 with possible associated optics 24.

For the rest, in FIG. 2 and the following Figures, the parts and elements which are identical or similar to those previously described with reference to FIG. 1 (e.g. component 10, board 12, package 14, contacts 16 and 18, etc.) will be denoted in the following by the same references used in the foregoing, without repeating the description thereof.

In various embodiments as exemplified in FIG. 2 and the following Figures, an arrangement may be provided having at least one first electrical contact pad located in central portion CA of the soldering area, and at least one second electrical contact pad located in peripheral portion PA.

Various embodiments may omit thermal contact pads such as pad 20 of FIG. 1, while conferring the thermal dissipation function only to anode 16 and cathode 18, as they may consist of a material (e.g. a metal) being both electrically and thermally conductive.

Figure 3:
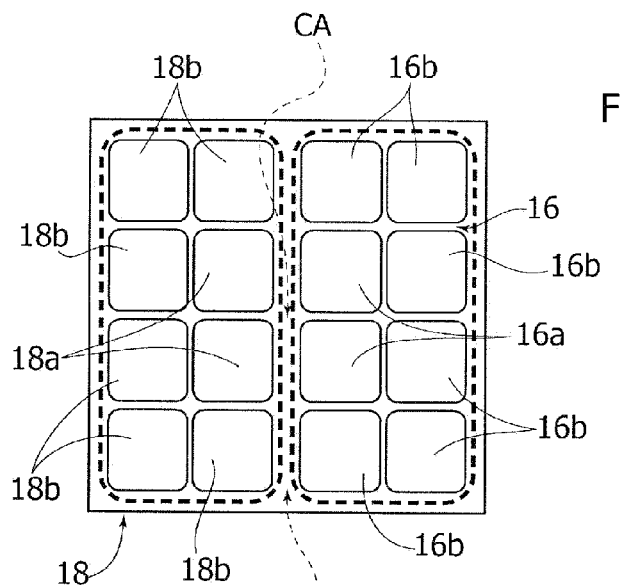
FIG. 3 shows electrical contact pads adapted to be used for a component according to various embodiments, as exemplified in FIG. 2, FIGS. 4 and 5 show possible solutions for mounting a component according to various embodiments onto a mounting board.

For example, in FIG. 3 (which may be considered, in the same way as FIGS. 6 to 10, as an ideal plan view of component 10 viewed from the back side, i.e. the side opposed to the front side visible in FIG. 2), anode pad 16 and cathode pad 18 are distributed practically over the whole soldering area (and therefore both on central portion CA and on peripheral portion PA), so as to perform, in addition to the electrical contact function, an action of thermal dissipation as well, without the need to provide a thermal contact pad 20.

For example, in various embodiments, in the absence of thermal contact pads such as pad 20 visible in FIG. 1, anode 16 and cathode 18 electrical contact pads may occupy a portion of the soldering area amounting to at least 50% of such soldering area, preferably to at least 70% of the soldering area, and most preferably to at least 90% of the soldering area, including central portion CA and peripheral portion PA.

For example, in various embodiments as exemplified in FIG. 3, anode 16 and cathode 18 electrical contact pads are "split" into two arrays according to a e.g. 4×4 matrix, which may be centred around central portion CA of the soldering area and may include:

four pads, respectively anode pads 16a and cathode pads 18a, arranged in central portion CA of the soldering area, and further twelve pads, respectively anode pads 16b and cathode pads 18b, arranged in peripheral portion PA.

Of course, neither the square shape nor the number of rows and columns of the matrix, i.e. the number of pads in the exemplified arrays, are in themselves compulsory features. In one or more embodiments, as a matter of fact, it is possible to adopt rectangular matrix arrangements or non-matrix arrays, e.g. circular or polygonal arrays, possibly including a different number of pads.

Various embodiments as exemplified in FIG. 3 may therefore envisage at least one first electrical contact pad (16a or 18a) arranged in central portion CA of the soldering area, and at least one second electrical contact pad 16b, 18b arranged in peripheral portion PA of the soldering area.

In various embodiments, as exemplified in FIG. 3, such a result may be achieved by each array, i.e. respectively the anode array (pad 16a, 16b) and the cathode array (pad 18a, 18b) including at least one first pad 16a, 18a arranged in central portion CA and at least one second pad 16*b*, 18*b* arranged in peripheral portion PA of the soldering area.

In various embodiments, the electrical connection between the pads of the respective arrays (i.e. the anode array 16*a*, 16*b* and the cathode array 18*a* and 18*b*) may be ensured e.g. through a short-circuit effect on the level of an electrically conductive (e.g. metal) interconnect layer 26, which is arranged on the front side of package 14 of device 10: see FIG. 2.

As previously stated, the creep strain due to thermal cycles may grow as a function of the distance from the centre of component 10 (portion CA) and therefore have peak levels at the corners of package 14. These may correspond to the outer corners of both pad arrays 16*a*, 16*b* and 18*a*, 18*b* shown in FIG. 3, with the consequent possible crack initiation at such corner portions. The splitting of electrical contact pads into multiple elements 16*a*, 16*b* and 18*a*, 18*b* contrasts crack propagation: although they are electrically connected with each other (e.g. one or more layers 26 on the front side of component 10), the various pads are physically separated from one another.

Figure 4:
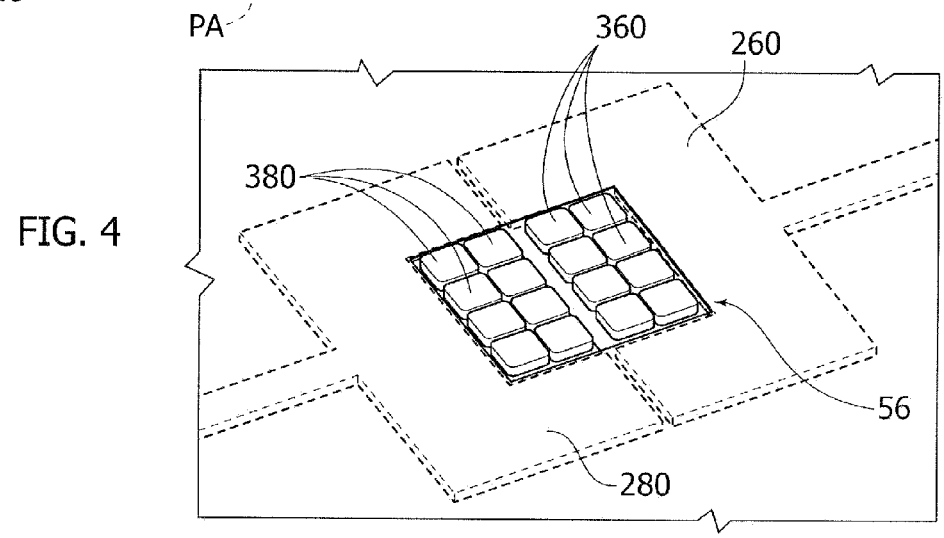
Figure 5:
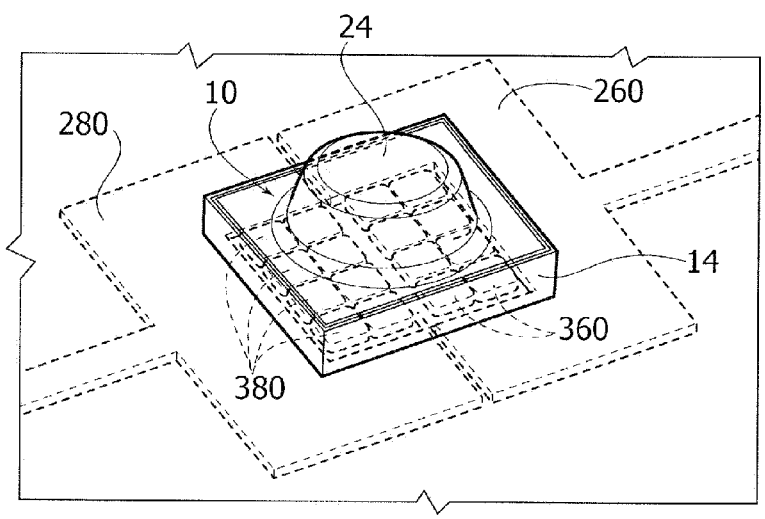

FIGS. 4 and 5 exemplify possible mounting options of a device 10 having electrical contact pads 16*a*, 16*b* and 18*a*, 18*b*, as exemplified in FIG. 3.

FIG. 4 exemplifies the possibility of using solder pastes which are applied (according to known criteria) onto board 12.

For example, on board 12 there may be formed electrically conductive lines ("tracks"), respectively an anode track 260 and a cathode track 280, on which there may be applied, for example by silk-screen printing with a solder mask 56, individual solder pastes 360, 380 on corresponding land areas, each solder paste 360, 380 being adapted to be interposed between a respective electrical contact pad 16*a*, 16*b*, 18*a*, 18*b* and a corresponding land area.

In various embodiments, such a result may be obtained either by splitting land areas into respective elements, on each of which a corresponding solder mask is applied, or by using a solder mask which is split into various distinct portions, so as to have respective window portions at each land area, or by using both solutions combined, i.e. by employing both land areas split into several portions and several separate portions of masking window.

Whatever the solution adopted, distinct solder pastes 360, 380 may be implemented, having a distribution corresponding to elements 16*a* and 16*b* and 18*a*, 18*b* respectively of anode and cathode contact pads.

Figure 6:
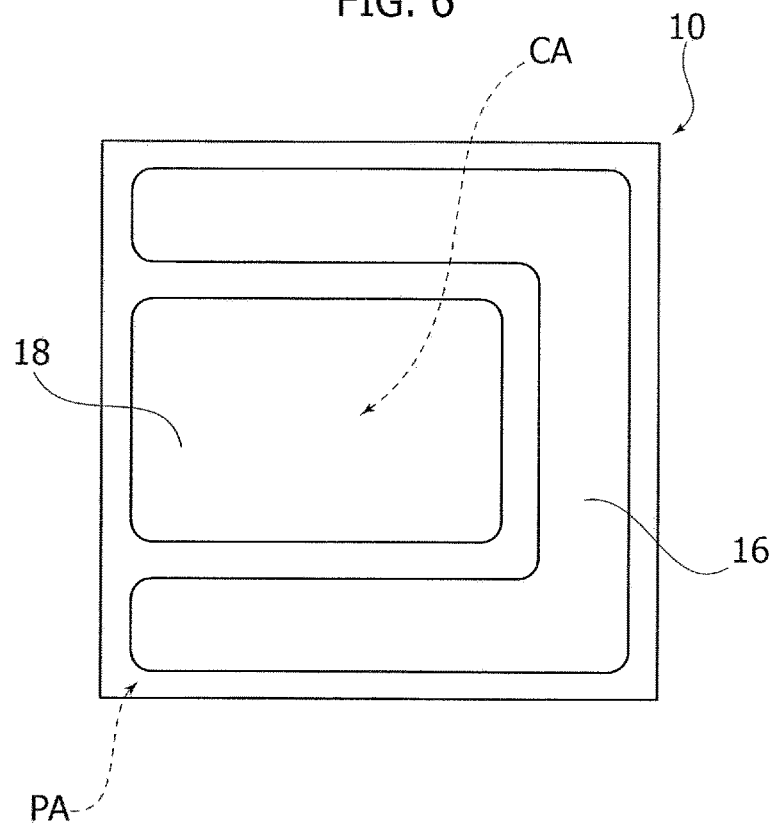

FIG. 6 and the following Figures exemplify embodiments which employ the same principle of having electrical contact (respectively anode and cathode) pads which also perform thermal dissipation, with a consequent elimination of thermal contact pad 20 adopted in conventional solutions such as depicted in FIG. 1.

The solution moreover includes:

(at least) one first electrical contact pad, e.g. a cathode, denoted as 18 in FIG. 6 and located, at least substantially, in central portion CA of the soldering area, (at least) one second electrical contact pad, e.g. an anode, denoted as 16 in FIG. 6 and having a C-shape or horseshoe shape, so as to embrace the first electrical contact pad 18, the second electrical contact pad being located in peripheral portion PA of the soldering area.

In this respect it will be appreciated that the identification of "central" pad 18 as the cathode pad and of "peripheral" pad 16 as the anode pad is merely exemplary, because the function of both pads might be reversed.

Figure 7:
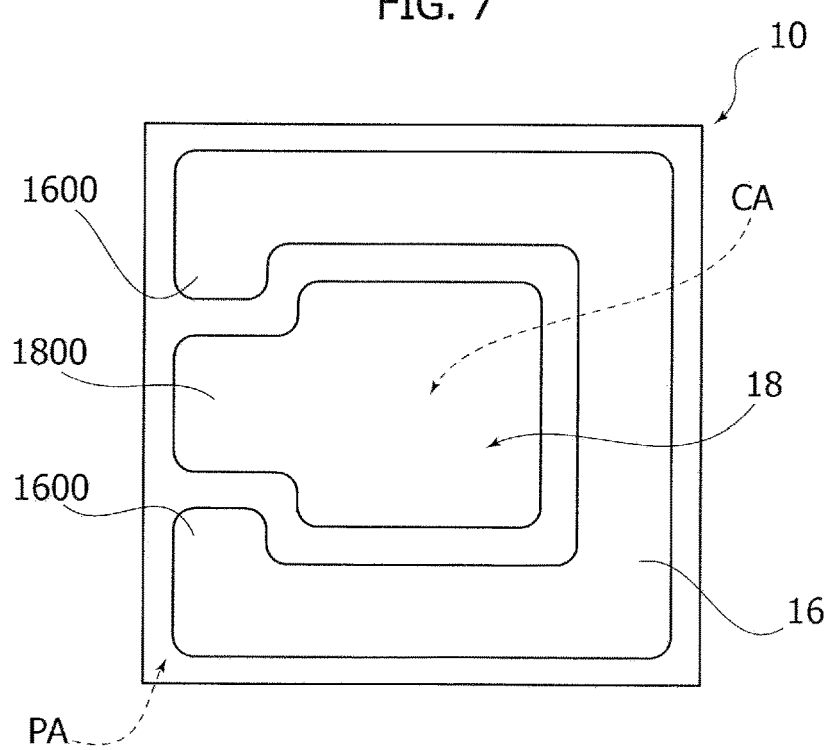

FIG. 7 shows one or more embodiments wherein central contact pad 18 shows a radial extension 1800 extending towards peripheral portion PA with a width which is shorter than the width of the portion of central pad 18 located at central portion CA. Moreover, the side branches of the C-shape or the horseshoe shape of peripheral contact pad 16 have distal portions 1600 facing inwards the horseshoe shape, so as to extend towards radial extension 1800 of central contact pad 18.

In comparison with the embodiments exemplified in FIG. 6, one or more embodiments as exemplified in FIG. 7 show the feature of having a peripheral pad 16 with an area extending further than the area of peripheral pad 16 exemplified in FIG. 6, so as to make pad 16 even more resistant to cracking stresses which may arise in peripheral portion PA of component 10.

For the rest, it will be appreciated that the surface size (area) of electrical contact pads 16 and 18 may be determined on the basis of use and application requirements.

FIG. 8 exemplifies one or more embodiments wherein the criteria described with reference to the embodiments exemplified in FIGS. 6 and 7 are applied by keeping the C-shape or horseshoe shape of "peripheral" contact pad 16, which is however split into two individually formed pads, in turn C-shaped or horseshoe-shaped, respectively an internal pad 160*a* and an external pad 160*b*.

As in the case of the various contact pads 16*a*, 16*b* and 18*a*, 18*b* of the embodiment exemplified in FIG. 3, the electrical contact between pads 160*a* and 160*b* may be obtained with a short-circuit layer 26 provided on the front side of package 14 (see for example FIG. 2).

The embodiments exemplified in FIGS. 6 and 8 aim at increasing the size (e.g. the extension area) of the "peripheral" electrical contact pad 16, which is more exposed to thermal cycle strains adapted to cause cracks in the solder joint. Moreover, the possibility is given to obtain a smaller size of central electrical contact pad 18, which is less subjected to such strains because it is located (at least mainly) at central portion CA. In one or more embodiments, as exemplified in FIG. 7, this criterion may be further developed by increasing the size (surface area) of peripheral electrical contact pad 16 with respect to the size of central electrical contact pad 18.

Various embodiments as exemplified in FIG. 8 may associate, to the size increase of peripheral electrical contact pad 16, the solution of splitting such a pad, more sensitive to thermal stresses, into at least two elements (the criterion exemplified referring to the pair of pads 160*a*, 160*b* might be extended to a higher number of elements), so that possible crack events in the exterior element (160*b* in the Figures) will not propagate towards inner element 160*a*, which is physically separated from element 160*b* (the electrical connection being provided e.g. by short-circuit layer 26 on the front side of package 14).

FIG. 9 exemplifies the possibility of extending such a splitting criterion to the central electrical contact pad as well, by physically separating a portion 180*b* thereof which is not located in central portion CA (and which therefore is potentially more sensitive to cracks) from portion 180*a* which is wholly arranged in central portion CA, i.e. which is less sensitive to cracks. In this case, too, the electrical connection between both pads 180*a* and 180*b* (which are physically separated from each other) may be provided by a short-circuit layer 26 on the front side of package 14.

As previously stated, the possible splitting into two elements both of peripheral pad 16 (FIGS. 8 and 9) and of central pad 18 (FIG. 9) may be extended to a higher number of elements.

FIG. 10 exemplifies the possibility of achieving a distribution of electrical contact pads which is substantially similar to what is shown in FIG. 3 as regards the geometry of both pad arrays on the back side of component 10 (i.e. a matrix which may be centred around central portion CA of the soldering area), but with different electrical contact arrangements (which again are adapted to be obtained with a short-circuit layer 26 on the front side of package 14).

In various embodiments, as exemplified in FIG. 10, there may be provided:

a first electrical contact array (e.g. a cathode array) including four pads 18a arranged in central portion CA of the soldering area, and two pads 18b arranged in peripheral portion PA, and a second C-shaped or horseshoe-shaped array of electrical contact pads (e.g. an anode array) surrounding first pad 18 and including an array of ten pads 160 which are all arranged in peripheral portion PA of the soldering area.

Various embodiments as exemplified in FIG. 10 aim at a size increase of the peripheral electrical contact (pad) 160 which is most exposed to the strains deriving from thermal cycles, combined with the criterion of splitting both electrical contacts, anode and cathode, into a plurality of pads, which are electrically connected to each other, e.g. through a layer 26, but which are physically separated from each other, so as to counter the crack propagation.

In the same way, in the embodiments as exemplified in FIG. 10, neither the square shape nor the number of rows and columns in the matrix, i.e. the number of pad in the exemplified arrays, are in themselves mandatory features. As a matter of fact, in one or more embodiments there may be provided, for example, either matrix arrangements with rectangular shape, or non-matrix arrays which may be circular, polygonal etc., possibly including a different number of pads.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. An electronic component comprising electrical contact pads for soldering onto a mounting board, the electrical contact pads arranged over a soldering area having a central portion and a peripheral portion surrounding the central portion, wherein the electrical contact pads comprise:
   at least one first electrical contact pad at the central portion of the soldering area and at a center portion of the electronic component, and
   at least one second electrical contact pad at the peripheral portion of the soldering area,
   wherein the at least one second electrical contact pad is horseshoe-shaped and encircles at least in part the at least one first electrical contact pad; and
   wherein a radial extension of the at least one first electrical contact pad at the central portion of the soldering area extends over the peripheral portion of the soldering area and a distal portion of the at least one second electrical contact pad overhangs or protrudes towards the radial extension of the at least one first electrical contact pad and faces inward with respect to the horseshoe-shape.

2. The electronic component of claim 1, wherein said contact pads occupy at least 50%, of said first and second electrical soldering area.

3. The electronic component of claim 1, wherein said at least one first electrical contact pad and said at least one second electrical contact pad are a cathode contact pad and an anode contact pad, respectively.

4. The electronic component of claim 1, wherein the electronic component includes a solid state light radiation source.

5. The electronic component of claim 1, wherein said first and second electrical contact pads occupy at least 70% of said soldering area.

6. The electronic component of claim 1, wherein said first and second electrical contact pads occupy at least 90% of said soldering area.

7. The electronic component of claim 1, wherein the electronic component includes a LED light radiation source.

8. The electronic component of claim 1, wherein a width of the radial extension of the at least one first electrical contact pad at the peripheral portion is narrower than a width of the at least one first electrical contact pad located at the central portion.

* * * * *